(12) United States Patent
Jeong et al.

(10) Patent No.: US 10,150,890 B2
(45) Date of Patent: Dec. 11, 2018

(54) CMP SLURRY COMPOSITION FOR POLISHING COPPER AND POLISHING METHOD USING THE SAME

(71) Applicant: SAMSUNG SDI CO., LTD., Yongin-si, Gyeonggi-do (KR)

(72) Inventors: Jeong Hwan Jeong, Uiwang-si (KR); Young Chul Jung, Uiwang-si (KR); Dong Hun Kang, Uiwang-si (KR); Tae Wan Kim, Uiwang-si (KR); Jong Il Noh, Uiwang-si (KR); Chang Ki Hong, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/525,321

(22) PCT Filed: Dec. 7, 2015

(86) PCT No.: PCT/KR2015/013336
§ 371 (c)(1),
(2) Date: May 9, 2017

(87) PCT Pub. No.: WO2017/043701
PCT Pub. Date: Mar. 16, 2017

(65) Prior Publication Data
US 2017/0335139 A1    Nov. 23, 2017

(30) Foreign Application Priority Data

Sep. 8, 2015 (KR) .......................... 10-2015-0127168

(51) Int. Cl.
| | |
|---|---|
| *C09G 1/02* | (2006.01) |
| *B24B 37/04* | (2012.01) |
| *C09K 3/14* | (2006.01) |
| *C23F 3/04* | (2006.01) |
| *H01L 21/321* | (2006.01) |

(52) U.S. Cl.
CPC .............. *C09G 1/02* (2013.01); *B24B 37/044* (2013.01); *C09K 3/1409* (2013.01); *C09K 3/1436* (2013.01); *C09K 3/1463* (2013.01); *C23F 3/04* (2013.01); *H01L 21/3212* (2013.01)

(58) Field of Classification Search
CPC ...... C09G 1/02; B24B 37/044; C09K 3/1409; C23F 3/04
See application file for complete search history.

(56) References Cited

U.S. PATENT DOCUMENTS

| | | | |
|---|---|---|---|
| 2010/0181525 A1* | 7/2010 | Belmont ................ | B82Y 30/00 252/79.1 |
| 2012/0208344 A1* | 8/2012 | Lauter ..................... | C09G 1/02 438/411 |

FOREIGN PATENT DOCUMENTS

| | | |
|---|---|---|
| CN | 102597142 A | 7/2012 |
| JP | 11-33896 A | 2/1999 |
| JP | 2001-164239 A | 6/2001 |
| KR | 10-2010-0128049 A | 12/2010 |
| KR | 10-2013-0077699 A | 7/2013 |
| KR | 10-2014-0079003 A | 6/2014 |
| KR | 10-2014-0086751 A | 7/2014 |
| TW | 200420696 A | 10/2004 |

OTHER PUBLICATIONS

Taiwanese Office Action dated Apr. 24, 2017, of the corresponding Taiwanese Patent Application No. 105128840.
Korean Office Action dated Feb. 12, 2018, in the corresponding Korean Patent Application No. 10-2015-0127168 claimed as the priority.
Chinese Office Action dated May 25, 2018.

* cited by examiner

*Primary Examiner* — Duy Vu N Deo
(74) *Attorney, Agent, or Firm* — Lee & Morse, P.C.

(57) ABSTRACT

Disclosed herein is a CMP slurry composition for polishing copper. The CMP slurry composition includes: polishing particles; and deionized water, wherein the polishing particles include inorganic particles and organic particles, and both the inorganic particles and the organic particles have a positive zeta potential. A polishing method comprising polishing a copper wire using the CMP slurry composition also be provided.

12 Claims, No Drawings

CMP SLURRY COMPOSITION FOR POLISHING COPPER AND POLISHING METHOD USING THE SAME

CROSS REFERENCE TO RELATED APPLICATIONS

This is the U.S. national phase application based on PCT Application No. PCT/KR2015/013336, filed Dec. 7, 2015, which is based on Korean Patent Application No. 10-2015-0127168, filed Sep. 8, 2015, the entire contents of all of which are hereby incorporated by reference.

TECHNICAL FIELD

The present invention relates to a CMP slurry composition for polishing copper and a polishing method using the same. More particularly, the present invention relates to a CMP slurry composition used in polishing metal wires such as copper wires in semiconductor fabrication, and a polishing method using the same.

BACKGROUND ART

In fabrication of semiconductor devices, a CMP (chemical mechanical planarization) process is used in planarization of an insulating layer or metal layer on a wafer surface or wafer. For example, a Cu layer is deposited to a thickness of 30,000 Å or more in a through-silicon via (TSV) process during fabrication of semiconductor devices. A CMP slurry composition is used in polishing such a Cu layer. In a process in which such a CMP slurry composition is used to polish the Cu layer, it is necessary to secure an appropriate planarization degree along with a sufficient polishing rate. Otherwise, a polishing time becomes longer or surface defects such as erosion and dishing can occur.

In the CMP process, a polishing pad is placed on a polishing platen, followed by application of hydrostatic pressure while a polishing head holds and rotates a wafer during rotation of the polishing platen. As a result, the CMP process can planarize a wafer surface layer through polishing using mechanical polishing action by the polishing pad and a polishing agent of a polishing slurry composition and chemical polishing action by an oxidant of the polishing slurry composition. Generally, a polishing slurry composition used in CMP may include: a polishing agent of metal oxide particles; deionized (DI) water in which the polishing agent is suspended; an oxidant removing a metal oxide by forming a passivation layer on a surface of a metal film; a corrosion inhibitor preventing excessive corrosion by passivation; and a complexing agent chelating the metal oxide oxidized by the oxidant.

Recently, there has been proposed a method in which organic particles are used instead of a polishing agent of metal oxide particles. However, typical organic particles exhibit poorer physical properties than metal oxide particles and thus have lower polishing rate. Particularly, typical organic particles have a negative (−) surface charge, and a Cu layer is oxidized into CuO or $Cu_2O$ during polishing and thus also has a negative (−) surface charge. As a result, a repulsive force is created between the organic particles and the Cu layer, causing reduction in polishing amount.

Therefore, there is a need for a CMP slurry composition which has better polishing properties than typical organic particles while exhibiting excellent polishing rate.

DISCLOSURE

Technical Problem

It is an aspect of the present invention to provide a CMP slurry composition for polishing copper which can improve a polishing force upon polishing of metal wires, particularly copper wires, and a polishing method using the same.

It is another aspect of the present invention to provide a CMP slurry composition for polishing copper which can reduce surface defects of a polishing object while improving a polishing force using both inorganic particles and organic particles, and a polishing method using the same.

Technical Solution

One aspect of the present invention relates to a CMP slurry composition for polishing copper including: polishing particles; and deionized water, wherein the polishing particles include inorganic particles and organic particles, and both the inorganic particles and the organic particles have a positive zeta potential.

The zeta potential may range from about +1 mV to about +100 mV.

The composition may have a pH of about 5 to about 9.

The polishing particles may have an average particle diameter (D50) of about 10 nm to about 500 nm, and average particle diameter (D50) of the organic particles (D2) may be greater than average particle diameter (D50) of the inorganic particles (D1).

An average particle diameter (D50) ratio of the organic particles to the inorganic particles (D2/D1) may be greater than about 1 and less than or equal to about 6.

The inorganic particles may be silica ($SiO_2$), alumina ($Al_2O_3$), zirconia, ceria, or a mixture thereof.

A cationic initiator may be chemically bonded to surfaces of the organic particles.

The cationic initiator may include at least one AIBN (azobisisobutyronitrile) cationic initiator selected from among 2,2'-azobis(2-methylpropionamidine)dihydrochloride, 2,2'-azobis[2-(2-imidazoline-2-yl)propane]dihydrochloride, 2,2'-azobis[2-(2-imidazoline-2-yl)propane]disulfate dihydrate, 2,2'-azobis[N-(2-carboxyethyl)-2-methylpropionamide], 2,2'-azobis[2-(3,4,5,6-tetrahydropyrimidine-2-yl)propane]dihydrochloride, 2,2'-azobis{2-[1-(2-hydroxyethyl)-2-yl]propane}dihydrochloride, 2,2'-azobis{2-methyl-N-[2-(hydroxybutyl)]propionamide}, 2,2'-azobis[2-methyl-N-[2-(hydroxyethyl)propionamide], and 2,2'-azobis(N-butyl-2-methylpropionamide).

The CMP slurry composition may further include: a corrosion inhibitor, a pH regulator, a surfactant, an oxidant, a complexing agent, or a combination thereof.

The CMP slurry composition may include: about 0.01 wt % to about 20 wt % of the polishing particles; about 0.01 wt % to about 10 wt % of the oxidant; about 0.001 wt % to about 10 wt % of the corrosion inhibitor; about 0.01 wt % to about 20 wt % of the complexing agent; and the balance of deionized water.

The polishing particles may include the inorganic particles and the organic particles in a weight ratio of about 1:0.1 to about 1:0.5.

Another aspect of the present invention relates to a polishing method using the CMP slurry composition as set forth above. The method includes polishing a copper wire using the CMP slurry composition.

Advantageous Effects

According to the present invention, the CMP slurry composition for polishing copper can secure high polishing force and high polishing rate while minimizing surface defects of a polishing object using both inorganic particles and organic particles as polishing particles.

BEST MODE

According to embodiments of the present invention, a CMP slurry composition is used in a process of polishing metal wires, for example, copper wires, which are used as a conductive layer of semiconductor devices. The CMP slurry composition includes: polishing particles; and deionized water.

The CMP slurry composition may further include a corrosion inhibitor, a pH regulator, a surfactant, an oxidant, a complexing agent, a dispersant, a modifier or combinations thereof.

Hereinafter, each of the components will be described in detail.

(A) Polishing Particles

The CMP slurry composition includes polishing particles (A), and the polishing particles include inorganic particles (a1) and organic particles (a2) having the same charge. Specifically, both the inorganic particles and the organic particles have a positive zeta potential.

In one embodiment, each of the inorganic particles (a1) and the organic particles (a2) has a zeta potential of about +1 mV to about +100 mV, specifically about +10 mV to about +35 mV, for example, about +10 mV, +11 mV, +12 mV, +13 mV, +14 mV, +15 mV, +16 mV, +17 mV, +18 mV, +19 mV, +20 mV, +21 mV, +22 mV, +23 mV, +24 mV, +25 mV, +26 mV, +27 mV, +28 mV, +29 mV, +30 mV, +31 mV, +32 mV, +33 mV, +34 mV, or +35 mV. Within this range, the polishing particles can secure sufficient dispersibility and thus can achieve high polishing rate for a copper layer. Here, the zeta potential is measured on 0.01 wt % of a specimen placed in a 0.001M NaCl solution by dynamic electrophoretic light scattering (ELS-8000, Otsuka Electronics).

The inorganic particles (a1) may include a metal oxide, the surface of which has a positive (+) zeta potential. For example, the inorganic particles (a1) may include silica ($SiO_2$), the surface of which has a positive zeta potential, alumina ($Al_2O_3$), the surface of which has a positive zeta potential, zirconia, the surface of which has a positive zeta potential, ceria, the surface of which has a positive zeta potential, or a mixture thereof.

Herein, the term "metal" in the term "metal oxide" refers to an alkali metal, an alkaline earth metal, a transition metal, a post-transition metal, a metalloid, and the like.

The organic particles may be prepared through polymerization of a monomer in the presence of a cationic initiator. The cationic initiator may be used in amount of about 0.001 parts by weight to about 15 parts by weight based on 100 parts by weight of the monomer. Within this range, surfaces of the organic particles can be sufficiently surrounded by the cationic initiator.

As the monomer, a vinyl group-containing monomer may be used. For example, the monomer may include an aromatic vinyl monomer, a vinyl cyanide monomer, an acrylic monomer, and an olefin monomer, without being limited thereto. These may be used alone or as a mixture thereof.

Among these monomers, an aromatic vinyl monomer, particularly a styrene monomer is preferably used.

Although polymerization of the monomer may be performed by any suitable method known in the art, suspension polymerization is preferably employed. Typical organic particles have lower physical properties than a metal oxide and thus exhibit lower polishing rate. According to the present invention, it is possible to provide a surface charge different from that of a layer to be polished to the organic particles so as to cause generation of attractive force between the organic particles and the layer. Such attractive force can cause the organic particles under pressure to rub against a surface to be polished during polishing. Here, unlike metal oxide particles, the organic particles can be in surface contact with the surface rather than being in point contact due to elasticity thereof and thus can exhibit better polishing properties than typical organic particles.

Examples of organic particles polymerized by the above method may include polystyrene, poly(meth)acrylate, polyvinyl chloride, polyacetal, polyester, polyamide, polyimide, or a copolymer thereof. The poly(meth)acrylate may be, for example, poly(methyl (meth)acrylate).

The organic particles polymerized as above can have a structure in which a cationic initiator is chemically bonded to the surfaces thereof.

The cationic initiator may include AIBN cationic initiators such as 2,2'-azobis(2-methylpropionamidine)dihydrochloride, 2,2'-azobis[2-(2-imidazoline-2-yl)propane]dihydrochloride, 2,2'-azobis[2-(2-imidazoline-2-yl)propane]disulfate dihydrate, 2,2'-azobis[N-(2-carboxyethyl)-2-methylpropionamide], 2,2'-azobis[2-(3,4,5,6-tetrahydropyrimidine-2-yl)propane]dihydrochloride, 2,2'-azobis{2-[1-(2-hydroxyethyl)-2-yl]propane}dihydrochloride, 2,2'-azobis{2-methyl-N-[2-(hydroxybutyl)]propionamide}, 2,2'-azobis[2-methyl-N-[2-(hydroxyethyl)propionamide], and 2,2'-azobis(N-butyl-2-methylpropionamide), without being limited thereto. These compounds may be used alone or as a mixture thereof. As such, the cationic initiator is used to positively charge a surface charge of the organic particles, thereby causing attractive force between a Cu layer and the particles. As a result, the organic particles can exhibit improved polishing force as compared with typical organic particles.

In some embodiments, the polishing particles may have a zeta potential of about +1 mV to about +100 mV, specifically about +10 mV to about +35 mV, for example, +10 mV, +11 mV, +12 mV, +13 mV, +14 mV, +15 mV, +16 mV, +17 mV, +18 mV, +19 mV, +20 mV, +21 mV, +22 mV, +23 mV, +24 mV, +25 mV, +26 mV, +27 mV, +28 mV, +29 mV, +30 mV, +31 mV, +32 mV, +33 mV, +34 mV, or +35 mV. Within this range, the CMP slurry composition can exhibit a high polishing rate for a Cu layer. Here, the zeta potential is measured on 0.01 wt % of a specimen placed in a 0.001M NaCl solution by dynamic electrophoretic light scattering (ELS-8000, Otsuka Electronics).

The organic particles may have a weight average molecular weight of about 100,000 g/mol to about 400,000 g/mol. Within this range, the CMP slurry composition can exhibit a high polishing rate for a Cu layer.

In addition, the organic particles may have an elastic modulus of about 2000 MPa to about 4000 MPa. Within this range, the organic particles can be in surface contact with a Cu layer, thereby exhibiting excellent polishing force.

Each of the inorganic particles and the organic particles, which are the polishing particles, may have an average particle diameter (D50) of about 10 nm to about 500 nm, and the average particle diameter (D50) of the organic particles (D2) may be greater than the average particle diameter (D50) of the inorganic particles (D1). In one embodiment, an average particle diameter ratio of the organic particles to the inorganic particles (D2/D1) may be greater than about 1 and less than or equal to about 6, specifically greater than about 1 and less than or equal to about 3.5, for example, greater than about 1 and less than or equal to about 3.3, greater than about 1 and less than or equal to about 2.0, greater than about 1 and less than or equal to about 1.6, or greater than about 1 and less than or equal to about 1.5. Within this range, it is possible to further reduce surface defects of a layer to be polished.

The polishing particles may include the inorganic particles and the organic particles in a weight ratio of about 1:0.1 to about 1:0.5. Using both the organic particles and the inorganic particles can further reduce surface defects of a layer to be polished, as compared with using the inorganic particles alone.

The polishing particles may be present in an amount of about 0.01 wt % to about 20 wt % in the CMP slurry composition. Within this range, it is possible to secure dispersion stability and to easily adjust a polishing rate. Specifically, the polishing particles may be present in an amount of about 0.1 wt % to about 10 wt %, more specifically about 0.15 wt % to about 5 wt % in the CMP slurry composition. Within this range, it is possible to further secure dispersion stability and to further easily adjust polishing speed.

(B) Deionized Water

The polishing particles are suspended in deionized water to form a slurry. In addition, pH of the slurry may be maintained at a level of about 5 to about 9, for example, about 5, about 6, about 7, about 8, or about 9 through pH control. Within this range of pH, it is possible to provide good prevention of corrosion of a Cu layer.

(C) Oxidant

The oxidant serves to promote chemical polishing by oxidizing a surface of a metal layer, for example, a copper layer, which is a polishing object.

According to the present invention, the oxidant may include inorganic or organic per-compounds, bromic acid and salts thereof, nitric acid and salts thereof, chloric acid and salts thereof, chromic acid and salts thereof, iodic acid and salts thereof, iron and salts thereof, copper and salts thereof, rare-earth metal oxides, transition metal oxides, potassium ferricyanide, potassium dichromate, and the like. Among these materials, the oxidant is preferably hydrogen peroxide. In order to obtain an appropriate polishing rate and to reduce corrosion or pitting upon polishing, the oxidant may be present in an amount of about 0.01 wt % to about 10 wt %, specifically about 0.1 wt % to about 5 wt % in the slurry composition.

(D) Corrosion Inhibitor

The corrosion inhibitor serves as a polishing regulator enabling polishing by allowing removal through physical action of the polishing particles in a high step height area in which polishing occurs, while delaying chemical reaction of the oxidant to suppress corrosion in a low step height area in which polishing does not occur. The corrosion inhibitor may include nitrogen-containing compounds, for example, ammonia, alkyl amines, amino acids, imines, azoles, and the like. These may be used alone or in combination thereof. More effectively, the corrosion inhibitor is a compound including cyclic nitrogen compounds and derivatives thereof, and the corrosion inhibitor may be a compound that includes benzoquinone, benzyl butyl phthalate, and benzyldioxolane. In one embodiment, the corrosion inhibitor may include an isomeric mixture of 1,2,3-triazole, 1,2,4-triazole or 2,2'-[[(5-methyl-1H-benzotriazole-1-yl)-methyl]imino]bis-ethanol. In terms of corrosion suppression, polishing rate, dispersion stability of the slurry composition and surface properties of a polishing object, the corrosion inhibitor may be present in an amount of about 0.001 wt % to about 10 wt %, specifically about 0.001 wt % to about 5 wt %, more specifically about 0.001 wt % to about 3 wt % in the CMP slurry composition.

(E) Complexing Agent

The complexing agent serves to chelate copper oxide oxidized by the oxidant. That is, the complexing agent allows chelation of copper oxide to suppress re-adsorption of the copper oxide onto the copper layer, which is a polishing object, whereby a polishing rate for copper can be increased while reducing surface defects.

According to the present invention, the complexing agent may include organic acids and salts thereof, amino acids and salts thereof, alcohols such as di-alcohols, tri-alcohols, and poly-alcohols, amine-containing compounds, and the like. For example, the complexing agent may include ammonium acetate, ammonium oxalate, ammonium formate, ammonium tartrate, ammonium lactate, glycine, alanine, serine, aspartic acid, glutamic acid, proline, oxoproline, arginine, cysteine, histidine, tyrosine, leucine, lysine, methionine, valine, isoleucine, trionine, tryptophan, phenylalanine, ammonium tetrahydrate, aminobenzotriazole, aminobutyric acid, aminoethyl aminoethanol, aminopyridine, carbonyl compounds and salts thereof, carboxylic acid compounds and salts thereof, for example, carboxylic acid compounds containing at least one hydroxyl group and salts thereof, dicarboxylic acid compounds and salts thereof, tricarboxylic acid compounds and salts thereof, polycarboxylic acid compounds and salts thereof, and carboxylic acid compounds containing at least one sulfonic acid group and phosphorous (or phosphoric) acid group and salts thereof, without being limited thereto. These may be used alone or as a mixture thereof.

In terms of polishing rate, dispersion stability of the slurry, surface properties of a polishing object, improvement in wafer profile and large-area planarization, the complexing agent may be present in an amount of about 0.01 wt % to about 20 wt %, specifically about 0.1 wt % to about 10 wt % in the CMP slurry composition.

In addition to the components as set forth above, the CMP slurry composition may further include a surfactant, a modifier, a pH regulator, a dispersant, and the like.

According to the present invention, the CMP slurry composition may have a pH of about 5 to about 9, specifically about 6 to about 8. Within this range, the slurry composition can provide good prevention of corrosion of a copper layer.

Next, the present invention will be explained in more detail with reference to some examples. It should be understood that these examples are provided for illustration only and are not to be construed in any way as limiting the present invention.

Descriptions of known functions and constructions which may unnecessarily obscure the subject matter of the present invention will be omitted.

EXAMPLES

Example 1

In deionized water, 0.1 wt % of silica inorganic particles (a1) (surface treated and produced by SDI Chemicals) having an average particle diameter (D50) of 60 nm and a zeta potential of +20 mV was mixed with 0.05 wt % of styrene-acryl organic particles (a2) (produced by SDI Chemicals, Mw: 240,000 g/mol, elastic modulus: 2500 MPa) having an average particle diameter (D50) of 200 nm and a zeta potential of +30 mV, 0.05 wt % of a corrosion inhibitor (1,2,4-triazole), 1 wt % of an oxidant ($H_2O_2$), and 0.6 wt % of a complexing agent (serine) as an additive. Then, the slurry composition was adjusted to a pH of 7.0 using potassium hydroxide, thereby preparing a CMP slurry composition. Then, the CMP slurry composition was subjected to polishing evaluation as to the following properties. Results are shown in Table 1.

<Polishing Conditions>
Wafer for measurement of polishing rate: 300 mm Cu Blanket wafer
Polishing instrument: Reflexion LK 300 mm (AMAT Co., Ltd.)
Polishing pad: IC1010 k-groove (Rodel Co., Ltd.)
Polishing time: 30 s
Pressure: 2.6 psi
Platen rpm: 93 rpm
Head rpm: 87 rpm
Flow rate: 250 ml/min Example 2 and Comparative Examples 1 to 3

A CMP slurry composition was prepared in the same manner as in Example 1 except that the composition of the slurry composition and the components of the polishing particles were changed as listed in Table 1.

Property Evaluation
Cu polishing rate (A/min): A polishing rate was measured using a CMT-SR5000 resistance meter (AIT Co., Ltd.) under the above polishing conditions.
Number of defects: The number of surface defects such as scratches and residues was measured after polishing at a detector voltage of 750V or less using a surface defect analyzer (LS-6800, Hitachi Co., Ltd.).

As shown in Table 1, it can be seen that the slurry composition of Examples 1 and 2 had an excellent polishing rate for copper and could reduce the number of surface defects of a polishing object.

Conversely, it can be seen that the slurry compositions of Comparative Examples 1 and 2 using inorganic particles or organic particles alone had increased surface defects, and the slurry composition of Comparative Example 3 including polishing particles with a negative zeta potential suffered from reduction in polishing rate and had increased surface defects.

Although the present invention has been described with reference to some embodiments, it should be understood that various modifications, changes, alterations, and equivalent embodiments can be made by those skilled in the art without departing from the spirit and scope of the invention. Therefore, the scope of the invention should be limited only by the accompanying claims.

The invention claimed is:

1. A chemical mechanical planarization slurry composition for polishing copper, comprising:
   about 0.01 wt % to about 20 wt % of polishing particles;
   about 0.01 wt % to about 10 wt % of an oxidant;
   about 0.001 wt % to about 10 wt % of a corrosion inhibitor;
   about 0.01 wt % to about 20 wt % of a complexing agent; and
   a balance of deionized water,
   wherein the polishing particles comprise inorganic particles and organic particles, and
   both the inorganic particles and the organic particles having a positive zeta potential.

2. The chemical mechanical planarization slurry composition according to claim 1, wherein the zeta potential ranges from about +1 mV to about +100 mV.

TABLE 1

| | | Example 1 | Example 2 | Comparative Example 1 | Comparative Example 2 | Comparative Example 3 |
|---|---|---|---|---|---|---|
| Polishing particles | Inorganic particles (a1) | 0.1 | 0.1 | 0.1 | — | 0.1 |
| | Zeta potential of inorganic particles (a1) | +20 mV | +20 mV | +20 mV | — | −35 mV |
| | Organic particles (a2) | 0.05 | 0.05 | — | 0.05 | 0.05 |
| | Zeta potential of organic particles (a2) | +30 mV | +27 mV | — | +30 mV | −10 mV |
| | Zeta Potential of polishing particles (mV) | 27 | 24 | 20 | 30 | −10 |
| | Corrosion inhibitor | 0.05 | 0.05 | 0.05 | 0.05 | 0.05 |
| | Additive | 0.6 | 0.6 | 0.6 | 0.6 | 0.6 |
| | Oxidant | 1 | 1 | 1 | 1 | 1 |
| | Deionized water | 98.2 | 98.2 | 98.25 | 98.3 | 98.2 |
| Ratio of average particle diameter of polishing particles (inorganic particles (D1):organic particles (D2)) | | 1:3.3 | 1:1.6 | — | — | 1:3.3 |
| Weight ratio of polishing particles (inorganic particles:organic particles) | | 1:0.5 | 1:0.5 | 1:0 | 1:0.5 | 1:0.5 |
| | Slurry pH | 7 | 7 | 7 | 7 | 10 |
| | Cu polishing rate (Å/min) | 7300 | 7500 | 8000 | 1600 | 5000 |
| | Number of defects | 350 | 1000 | 1500 | 1300 | 2000 |

3. The chemical mechanical planarization slurry composition according to claim 1, wherein the chemical mechanical planarization slurry composition has a pH of 5 to 9.

4. The chemical mechanical planarization slurry composition according to claim 1, wherein the polishing particles have an average particle diameter (D50) of about 10 nm to about 500 nm, and average particle diameter (D50) of the organic particles is greater than average particle diameter (D50) of the inorganic particles.

5. The chemical mechanical planarization slurry composition according to claim 1, wherein a ratio D2/D1 of an average particle diameter (D50) ratio of the organic particles (D2) to an average particle diameter (D50) of the inorganic particles (D1) is greater than about 1 and less than or equal to about 6.

6. The chemical mechanical planarization slurry composition according to claim 1, wherein the inorganic particles are silica ($SiO_2$), alumina ($Al_2O_3$), zirconia, ceria, or a mixture thereof.

7. The chemical mechanical planarization slurry composition according to claim 1, wherein the organic particles are polystyrene, poly(meth)acrylate, polyvinyl chloride, polyacetal, polyester, polyamide, polyimide, or a copolymer thereof.

8. The chemical mechanical planarization slurry composition according to claim 1, wherein a cationic initiator is chemically bonded to surfaces of the organic particles.

9. The chemical mechanical planarization slurry composition according to claim 8, wherein the cationic initiator comprises at least one AIBN cationic initiator selected from among 2,2'-azobis(2-methylpropionamidine)dihydrochloride, 2,2'-azobis[2-(2-imidazoline-2-yl)propane]dihydrochloride, 2,2'-azobis[2-(2-imidazoline-2-yl)propane]disulfate dihydrate, 2,2'-azobis[N-(2-carboxyethyl)-2-methylpropionamide], 2,2'-azobis[2-(3,4,5,6-tetrahydropyrimidine-2-yl)propane]dihydrochloride, 2,2'-azobis{2-[1-(2-hydroxyethyl)-2-yl]propane}dihydrochloride, 2,2'-azobis {2-methyl-N-[2-(hydroxybutyl)]propionamide}, 2,2'-azobis[2-methyl-N-[2-(hydroxyethyl)propionamide], and 2,2'-azobis(N-butyl-2-methylpropionamide).

10. The chemical mechanical planarization slurry composition according to claim 1, further comprising:
a pH regulator, a surfactant, a dispersant, a modifier, or a combination thereof.

11. The chemical mechanical planarization slurry composition according to claim 1, wherein the polishing particles comprise the inorganic particles and the organic particles in a weight ratio of about 1:0.1 to about 1:0.5.

12. A polishing method comprising: polishing a copper wire using the chemical mechanical planarization slurry composition according to claim 1.

* * * * *